(12) United States Patent
Segawa et al.

(10) Patent No.: US 6,214,495 B1
(45) Date of Patent: Apr. 10, 2001

(54) PHASE MASK FOR PROCESSING OPTICAL FIBERS AND METHOD OF MANUFACTURING THE SAME

(75) Inventors: Toshikazu Segawa; Masaaki Kurihara, both of Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 09/254,086
(22) PCT Filed: Jul. 2, 1998
(86) PCT No.: PCT/JP98/02975
§ 371 Date: Apr. 13, 1999
§ 102(e) Date: Apr. 13, 1999
(87) PCT Pub. No.: WO99/01787
PCT Pub. Date: Jan. 14, 1999

(30) Foreign Application Priority Data

Jul. 3, 1997 (JP) .................................. 9-178405
Jun. 18, 1998 (JP) ................................ 10-170856

(51) Int. Cl.[7] .............................. G03F 9/00; G02B 6/02; G02B 6/18
(52) U.S. Cl. .......................................... 430/5; 385/124
(58) Field of Search ............................. 430/5, 321; 385/123, 385/124

(56) References Cited

U.S. PATENT DOCUMENTS 5,413,884 * 5/1995 Koch et al. ......................... 430/5
5,821,013 * 10/1998 Miller et al. ....................... 430/5

* cited by examiner

Primary Examiner—S. Rosasco
(74) Attorney, Agent, or Firm—Dellett and Walters (57) ABSTRACT

The invention relates to an optical fiber-processing phase mask which enables a phase mask with a groove pitch varying in a position-dependent manner to be easily obtained by electron beam writing, and its fabrication method. In the optical fiber-processing phase mask comprising on one surface of a transparent substrate a repetitive pattern of grooves (26) and strips (27) located in a grating form, so that an optical fiber is irradiated with diffracted light according to the repetitive pattern to make a diffraction grating in said optical fiber by an interference fringe of diffracted light of different orders, a plurality of patterns ($A_1$ to $A_3$) having a linearly or nonlinearly increasing or decreasing pitch are juxtaposed, with a constant width ratio between the grooves (26) and the strips (27). The phase mask is fabricated by carrying out writing while the groove-and-strip patterns with a different pitch are juxtaposed.

25 Claims, 7 Drawing Sheets

PHASE MASK FOR PROCESSING OPTICAL FIBERS AND METHOD OF MANUFACTURING THE SAME

ART FIELD

The present invention relates generally to a phase mask for processing optical fibers and its fabrication method, and more specifically to a phase mask for fabricating a diffraction grating in an optical fiber used for optical communications using ultraviolet laser light, and a method of fabricating the same.

BACKGROUND ART

Optical fibers have achieved global communication-technology breakthroughs, and enabled high-quality yet largecapacity transoceanic telecommunications. So far, it has been known that a Bragg diffraction grating is prepared in an optical fiber by providing a periodic index profile in a core along the optical fiber. By determining the magnitude of reflectance and the width of frequency characteristics of the diffraction grating depending on the period and length, and the magnitude of refractive index modulation thereof, the diffraction grating is used for wavelength division multiplexers for optical communication purposes, narrow-band high-reflecting mirrors used with lasers or sensors, wavelength selective filters for filtering out extra wavelengths in fiber amplifiers, etc.

However, the wavelength where quartz optical fibers show a minimum attenuation and which is suitable for long-haul communication systems is 1.55 $\mu$m. To use an optical fiber diffraction grating at this wavelength, a grating spacing of about 500 nm must be needed. Initially, to make such a fine structure in a core has been considered to be in itself difficult. Accordingly, some complicated process steps comprising side polishing, photoresist step, holography exposure, and reactive ion beam etching are used to make a Bragg diffraction grating in an optical fiber core. Much time is needed for such processes, resulting in limited yields.

In recent years, however, a method of making a diffraction grating by irradiating an optical fiber with ultraviolet radiation for the direct change of a refractive index in a core has been known in the art. This ultraviolet irradiation method has been steadily put to actual use with the progress of peripheral technologies due to no need of complex processes.

This method using ultraviolet light is now carried out by some processes such as an interference process comprising interference of two ray bundles, a writing-per-point process wherein a diffraction grating surface is formed one by one by focusing of a single pulse from an excimer laser), and an irradiation process using a phase mask having a grating, because the grating spacing is as fine as about 500 nm as mentioned above.

The interference process comprising interference of two ray bundles offers a problem in connection with the quality of lateral beams, i.e., spatial coherence, and the writing-per-point process have some operation problems such as the need of submicron careful step control, and the necessity of writing of many surfaces with fine pencils of light.

Figure 7A:
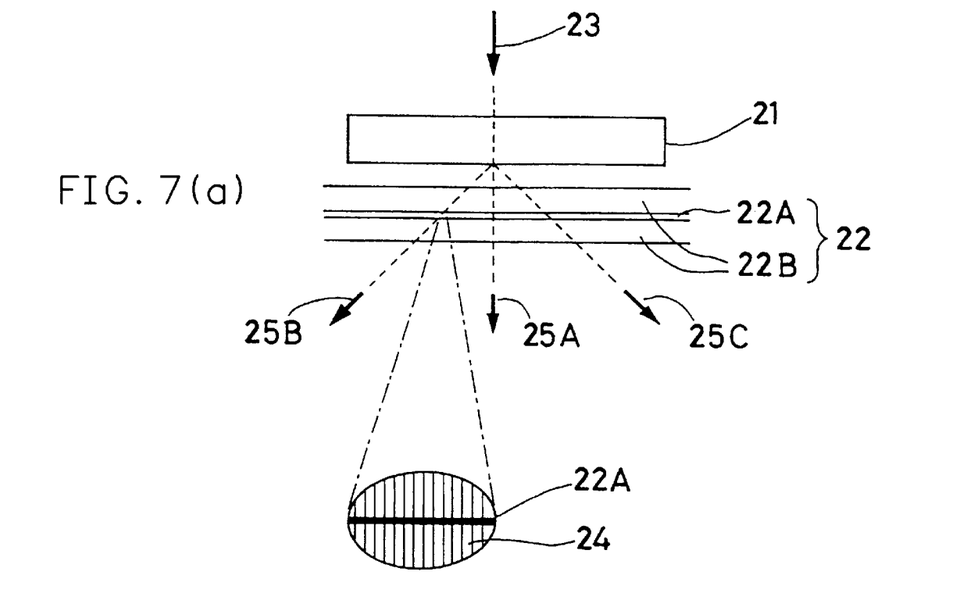
FIG. 7(a) to 7(c) are schematics for optical fiber processing and a phase mask used therewith.
Figure 7B:
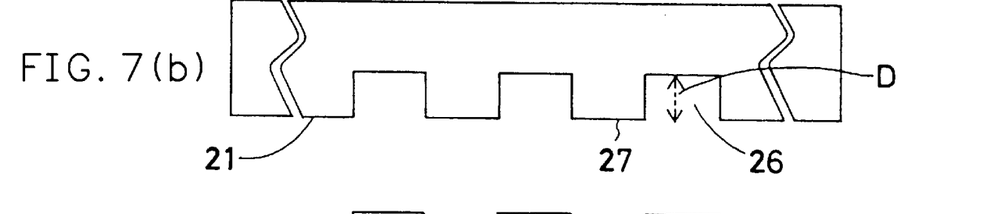
Figure 7C:
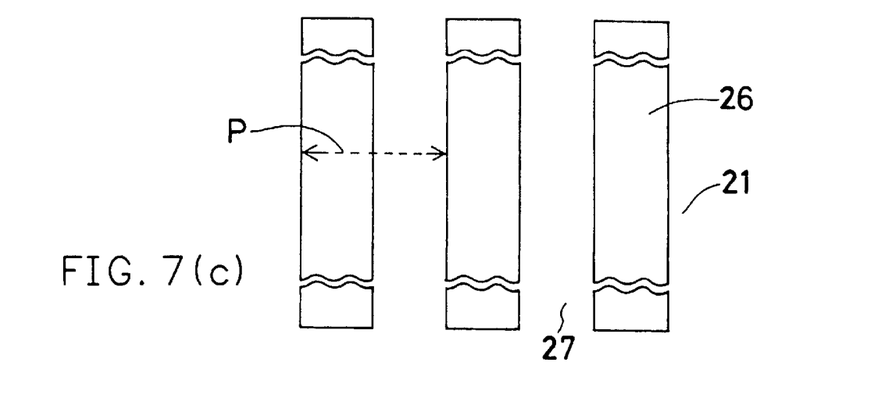

To address the above problems, an irradiation method using a phase mask has now received attention. As shown in FIG. 7(a), this method uses a phase shift mask 21 obtained by providing grooves on one side of a quartz substrate at a given pitch and a given depth. The phase shift mask 21 is then irradiated with KrF excimer laser light 23 (of 248-nm wavelength) to impart a refractive index change directly to a core 22A of an optical fiber 22, thereby forming a grating. It is here to be noted that reference numeral 22B stands for a cladding of the optical fiber 22. In FIG. 7(a), an interference pattern 24 in the core 22A is illustrated on an enlarged scale for a better illustration thereof. FIG. 7(b) is a sectional view of the phase mask 21, and FIG. 7(c) is a view illustrating a part of the upper surface of the phase mask 21. The phase mask 21 has a binary phase type diffraction grating structure wherein grooves 26, each having a depth D, are provided on one surface thereof at a repetitive pitch P, and a strip 27 having substantially the same width as that of each groove is provided between adjacent grooves 26.

The depth D (a height difference between strip 27 and groove 26) of each groove 26 on the phase mask 21 is selected such that the phase of the excimer laser light (beam) 23 that is the exposure light is modulated by a $\pi$ radian. Zero-order light (beam) 25A is reduced to 5% or lower by the phase shift ask 21, and primary light (beam) leaving the mask 21 is divided into plus first-order diffracted light 25B including 35% or more of diffracted light and minus first-order diffracted light 25C. By carrying out irradiation using an interference fringe at a given pitch determined by the plus first-order diffracted light 25B and the minus first-order diffracted light 25C, the refractive index change at this pitch is imparted to the core of the optical fiber 22.

The grating in the optical fiber, fabricated using such a phase mask 21 as mentioned above, has a constant pitch, and so the grooves 26 on the phase mask 21 used for grating fabrication, too, have a constant pitch.

Such a phase mask is fabricated by preparing pattern data corresponding to a grating form of groove pitch and carrying out writing with an electron beam writing system to form a grooved grating.

In this regard, a chirped grating wherein the grating pitch increases or decreases linearly or nonlinearly depending on the position of a grating groove in a direction perpendicular to the grating groove (the repetitive direction of grating) is now demanded for the Bragg diffraction grating to be formed in an optical fiber. Such a grating, for instance, is used for high-reflecting mirrors having a widened reflection band, and as delay time control means.

When such a grating having a grating pitch changing linearly or nonlinearly depending on the position of grooves in the lengthwise direction of an optical fiber is fabricated by the interference of plus first-order diffracted light and minus first-order diffracted light using a phase mask, it is required that the pitch of grooves on the phase mask, too, increase or decrease linearly or nonlinearly in a position-dependent manner, as can be seen from the principle shown in FIG. 7(a). The smaller the pitch of grooves on the phase mask, the larger the angle between the plus first-order diffracted light and the minus first-order diffracted light and the smaller the pitch of interference fringes. For the fabrication of such a phase mask with an electron beam writing system, an enormous amount of writing data is needed to write grooves or inter-groove strips all over the range of the mask. This often makes mask fabrication difficult.

DISCLOSURE OF THE INVENTION

In view of such problems with the prior art, an object of the invention is to provide a method of fabricating an optical fiber-processing phase mask which enables a phase mask with a groove pitch changing depending on the position of grooves in a direction perpendicular to the grooves to be easily fabricated by electron beam writing, and an optical fiber-processing phase mask fabricated by this method.

Another object of the invention is to provide an optical fiber-processing phase mask with a groove pitch changing depending on the position of grooves in a groove direction, and a method of fabricating the same by electron beam writing.

According to one aspect of the invention, these objects are achieved by the provision of an optical fiber-processing phase mask comprising on one surface of a transparent substrate a repetitive pattern of grooves and strips located in a grating form, so that an optical fiber is irradiated with diffracted light according to said repetitive pattern to make a diffraction grating in said optical fiber by an interference fringe of diffracted light of different orders, characterized by juxtaposition of a plurality of patterns having a linearly or nonlinearly increasing or decreasing pitch, with a constant width ratio between said grooves and said strips.

In this aspect of the invention, the patterns may be juxtaposed either in a direction perpendicular to the grooves or in a groove direction.

In the latter case, it is preferable that an amount of displacement between a groove in one pattern and a groove in another pattern adjacent thereto in a direction perpendicular to said grooves is within a width of one groove even at horizontal outermost ends.

In the first aspect of the invention, the pattern pitch may vary between 0.85 $\mu$m and 1.25 $\mu$m.

In the first aspect of the invention, it is preferable that the height difference between the grooves and the strips on said patterns is of such a magnitude that a phase shift of approximately $\pi$ occurs upon transmission of optical fiber-processing ultraviolet radiation.

According to another aspect of the invention, there is provided a method of fabricating an optical fiber-processing phase mask comprising on one surface of a transparent substrate a repetitive pattern of grooves and strips located in a grating form, so that an optical fiber is irradiated with diffracted light according to said repetitive pattern to make a diffraction grating in said optical fiber by an interference fringe of diffracted light of different orders, characterized in that a plurality of patterns comprising grooves and strips at a varying pitch are written in a juxtaposed relation, thereby fabricating said repetitive pattern of grooves and strips located in a grating form.

In this case, the patterns may be written while they are juxtaposed either in a direction perpendicular to the grooves or in a groove direction.

In the latter case, it is preferable that an amount of displacement between the grooves in one pattern and the grooves in another pattern adjacent thereto in a direction perpendicular to the grooves is within a width of one groove even at horizontal outermost ends.

In this method of fabricating an optical fiber-processing phase mask, it is preferable that the repetitive pattern of grooves and strips located in a grating form is fabricated by continuously writing groove-and-strip patterns having a varying pitch on the basis of writing data concerning a fundamental pattern comprising one groove and one strip while the reduced scale for the writing data concerning the fundamental pattern is varied.

It is also preferable that the position-dependent pitch change of the repetitive pattern of grooves and strips located in a grating form is determined depending on a pitch change of the diffraction grating being made in the optical fiber, and is caused by a position-dependent change of the reduced scale for the writing data concerning the fundamental pattern.

The pitch of the repetitive pattern of grooves and strips located in a grating form, for instance, may vary between 0.85 $\mu$m and 1.25 $\mu$m.

In the second aspect of the invention, it is preferable that the height difference between the grooves in the repetitive pattern of grooves and strips located in a grating form and the strips thereon is of such a magnitude that a phase shift of approximately $\pi$ occurs upon transmission of optical fiber-processing ultraviolet radiation.

According to the invention wherein there are juxtaposed a plurality of patterns having a linearly or nonlinearly increasing or decreasing pitch, with a constant width ratio between grooves and strips, a diffraction grating with a varying pitch can be easily fabricated in an optical fiber. In addition, writing data concerning a fundamental pattern comprising one groove and one strip is multiplied by the reduced scale rate to obtain writing data concerning the overall repetitive pattern of grooves and strips located in a grating form, which changes in pitch depending on the position in a direction perpendicular to the grooves or in a groove direction. The amount of writing data can thus be greatly reduced so that patterns can be easily fabricated. Further, this method enables a phase mask to be fabricated at any desired pitch.

BEST MODE FOR CARRYING OUT THE INVENTION

The optical fiber-processing phase mask of the invention, and the method of fabricating the same will now be explained with reference to some embodiments.

Figure 2A:
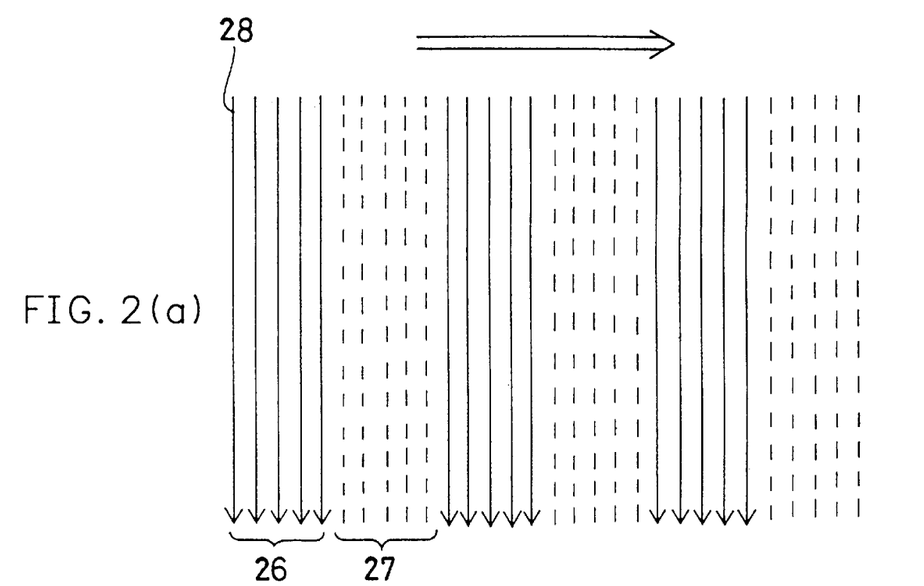
FIG. 2(a) is a schematic of an electron beam writing process used for phase mask fabrication.
Figure 2B:
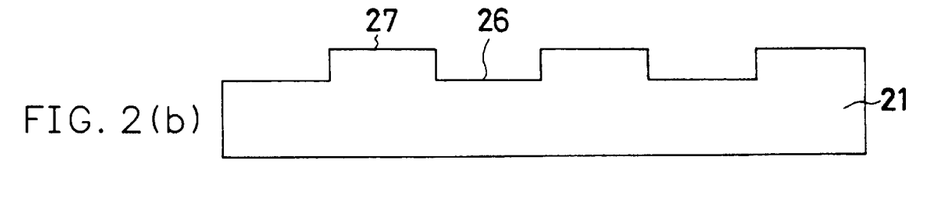
FIG. 2(b) is a sectional view of a phase mask.

FIG. 2(b) is a sectional view of a phase mask 21 comprising a repetitive alternate pattern of grooves 26 and strips 27 for making a Bragg diffraction grating in an optical fiber according to such an arrangement as shown in FIG. 7(a). Such a mask 21 is provided thereon with grooves 26 and strips 27 as shown in the FIG. 2(a) top view. Here consider the case where grooves 26 are written by exposure to electron beams in raster scan mode where electron beam scanning lines 28 move along grooves 26 and strips 27 are formed by blanking electron beam scanning, as shown by broken lines in FIG. 2(a). For exposure of the entire mask 21 to electron beams, raster scan is carried out in a direction shown by a double arrow in FIG. 2(a). At a position where groove 26 is to be written, the mask is actually scanned with a given number of scanning lines (5 lines in the illustrated embodiment), as mentioned above. Then, at a position where strip 27 is to be written, as many as scanning lines are blanked. By repetition of this operation, the phase mask 21 having a given length is exposed to electron beams.

When, according to the invention, the entire mask 21 is exposed to electron beams in the raster scan mode using electron beam scanning lines 28, the pitch of groove 26 or strip 27 is linearly or nonlinearly increased or decreased depending on the position of groove 26, in a direction perpendicular to groove 26 or a direction of groove 26. In this case, the width of groove 26 is increased or decreased depending on such a change. More specifically, while the number of scanning lines in the raster scan mode to write one groove 26 remains unchanged at any position, the inter-central distance of scanning lines 28 is increased or decreased depending on that change.

Figure 1:
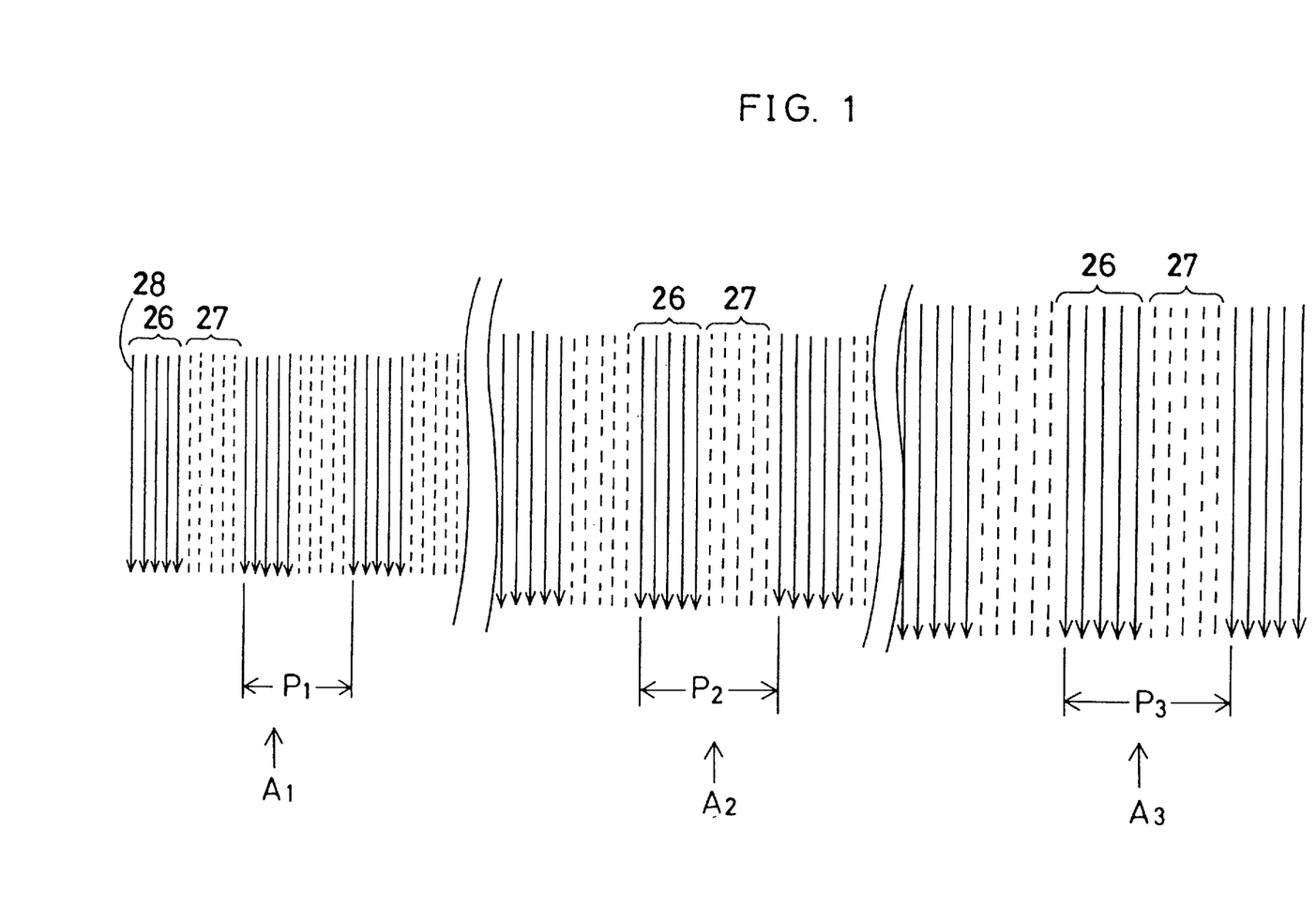
FIG. 1 is a top view of the first writing process used with the fabrication method of the invention.

FIG. 1 is a top view illustrative of the writing process where the pitch of grooves 26 or strips 27 is linearly or nonlinearly increased or decreased depending on the position of grooves 26 in the direction perpendicular to groove 26. A region $A_1$ sampled out of the left end of the phase mask 21 has groove pitch $P_1$ with respect to groove 26 or strip 27, a region $A_2$ sampled out of the center of the phase mask 21 has a pitch $P_2$ with respect to groove 26 or strip 27, and a region $A_3$ sampled out of the right end of the phase mask 21 has a pitch $P_3$ with respect to groove 26 or strip 27. Here assume $P_1<P_2<P_3$. The substrate of the phase mask 21 is scanned out sequentially by electron beam scanning lines 28 in the raster scan mode, from top to bottom and from left end to right end, thereby writing each groove 26 thereon. In this case, one groove 26 is written by the same number of scanning lines at all regions $A_1$, $A_2$ and $A_3$ (5 scanning lines in the illustrated embodiment). At the position where strip 27 is to be written, as many as scanning lines are blanked. For this reason, the inter-central distance of the scanning lines 28 changes with regions $A_1$, $A_2$ and $A_3$ depending on pitches $P_1$, $P_2$ and $P_3$.

When such a writing process is used, there is a possibility that unexposed portions may remain after development of an electron beam resist (see FIG. 6), because the areas of the portions between the scanning lines 28 and unexposed to electron beams to write grooves 26 vary with regions $A_1$, $A_2$ and $A_3$. However, this offers no problem at all, because the unexposed resist is actually removed upon development of the regions corresponding to the scanning lines 28.

As explained above, the pitch of grooves 26 or strips 27 on the phase mask 21 is linearly or nonlinearly increased or decreased depending on their position in the direction perpendicular to the grooves 26, so that the width of grooves 26 or strips 27 can be increased or decreased depending on such a change. By use of the writing process where one groove 26 is written in the raster scan mode using the same number of scanning lines at any position, it is possible to write the desired pattern all over the surface of the substrate of the phase mask 21 with electron beams. The writing data needed for this are only two, i.e., fundamental pattern data concerning one pitch of the mask 21, and a reduced scale variation function for the fundamental pattern data, which corresponds to a pitch variation function depending on the position of groove 26 in the direction perpendicular to the groove 26.

Figure 3:
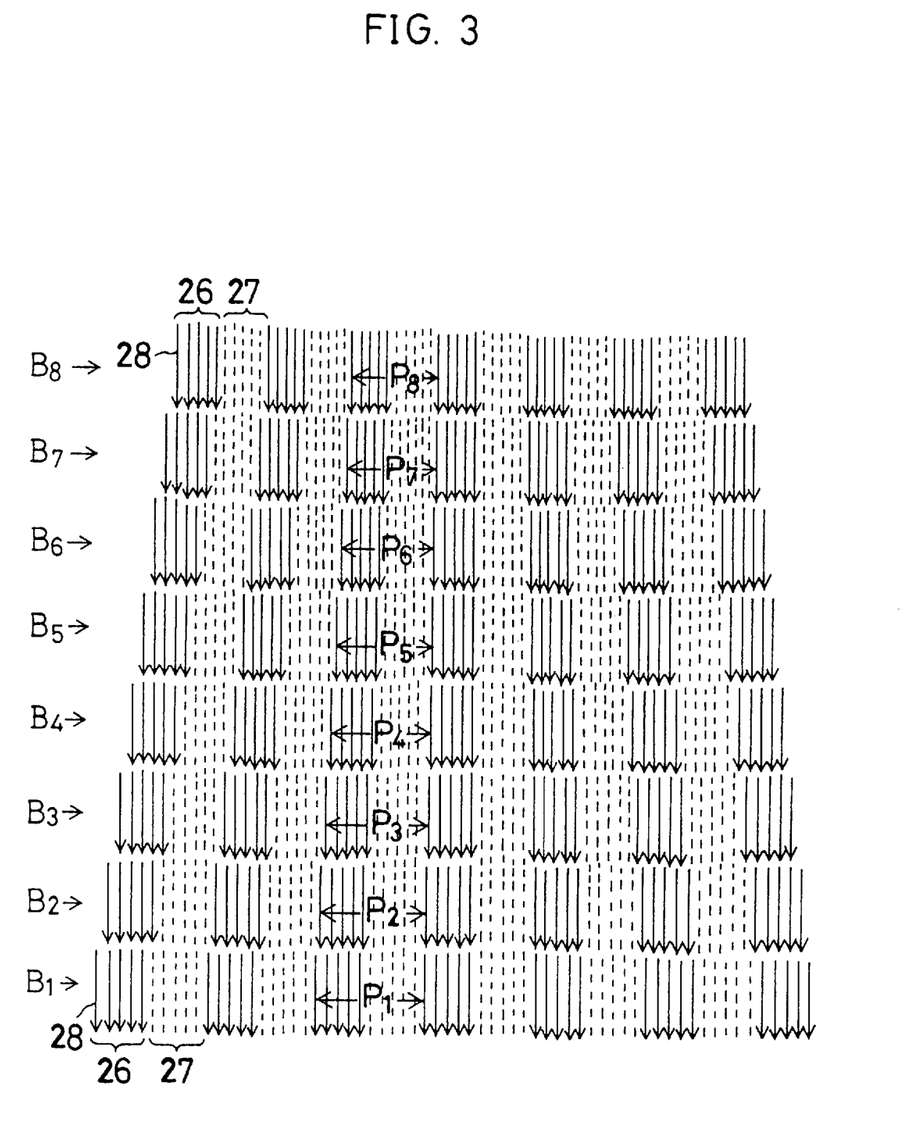
FIG. 3 is a top view of the second writing process used with the fabrication method of the invention.

FIG. 3 is a top view of the writing process wherein the pitch of grooves 26 or strips 27 are linearly or nonlinearly increased or decreased depending on their position in a direction of each groove 26. An region $B_1$ of a phase mask (21) substrate at its lowermost end along the direction of groove 26 has a pitch $P_1$ with respect to groove 26 or strip 27, a region $B_2$ positioned just above $B_1$ along the direction of groove 26 has a pitch $P_2$ with respect to groove 26 or strip 27, a region $B_3$ positioned just above $B_2$ along the direction of groove 26 has a pitch $P_3$ with respect to groove 26 or strip 27, ..., a region $B_7$ of the phase mask (21) substrate positioned just below its uppermost end along the direction of groove 26 has a pitch $P_7$ with respect to groove 26 or strip 27, and a region $B_8$ at the uppermost end along the direction of groove 26 has a pitch $P_8$ with respect to groove 26 or strip 27. Here assume $P_1>P_2>P_3>\ldots>P_7>P_8$. One region $B_n$ ($n=1$ to 7) is scanned with electron beams in the raster scan mode, from top to bottom, to write groove 26 thereon. Then, the next region $B_{n+1}$ is scanned in the same manner as mentioned. In this way, all regions $B_1$ to $B_8$ are scanned to write grooves 26 thereon. It is here to be understood that at all regions $B_1$ to $B_8$, one groove 26 is written with the same number of scanning lines (5 scanning lines in the illustrated embodiment). At a position where strip 27 is to be written, the same number of scanning lines are blanked during scanning. For this reason, the inter-central distance of the scanning lines 28 varies with regions $B_1$ to $B_8$ depending on pitches $P_1$ to $P_8$.

When such a writing process is used, there is a possibility that unexposed portions may remain after development of an electron beam resist (see FIG. 6), because the areas of the portions between the scanning lines 28 and unexposed to electron beams to write grooves 26 vary with regions $B_1$ to $B_8$. However, this offers no problem at all, because the unexposed resist is actually removed upon development of the regions corresponding to the scanning lines 28.

As explained above, the pitch of grooves 26 or strips 27 on the phase mask 21 is linearly or nonlinearly increased or decreased depending on their position in the direction perpendicular to grooves 26, so that the width of grooves 26 or strips 27 can be increased or decreased depending on such a change. By use of the writing process where one groove 26 is written in the raster scan mode using the same number of scanning lines at any position, it is possible to write the desired pattern all over the surface of the substrate of the phase mask 21 with electron beams. The writing data needed for this are only two, i.e., fundamental pattern data concerning one pitch of the mask 21, and a reduced scale variation function for the fundamental pattern data, which corresponds to a pitch variation function depending on the position of groove 26 in the direction perpendicular to the groove 26.

The phase mask 21 where the pitch of grooves 26 or strips 27 is linearly or nonlinearly increased or decreased depending on their position in the direction of grooves 26, as shown in FIG. 3, is suitable for the fabrication of a grating used to make a Bragg diffraction grating in an optical fiber, wherein the pitch thereof is linearly or nonlinearly increased or decreased depending on the groove position in the groove direction. Such a grating, for instance, is preferably used to allow the reflection wavelength of an optical fiber to vary in a position-dependent manner. The grooves 26 and strips 27 on such a phase mask 21 extend in a direction perpendicular to the sheet surface on which FIG. 7(a) is drawn, so that the pitch of the grating to be fabricated in an optical fiber 22 can be selectively controlled by control of the position of the grooves and strips in the direction perpendicular to the sheet surface.

Figure 4:
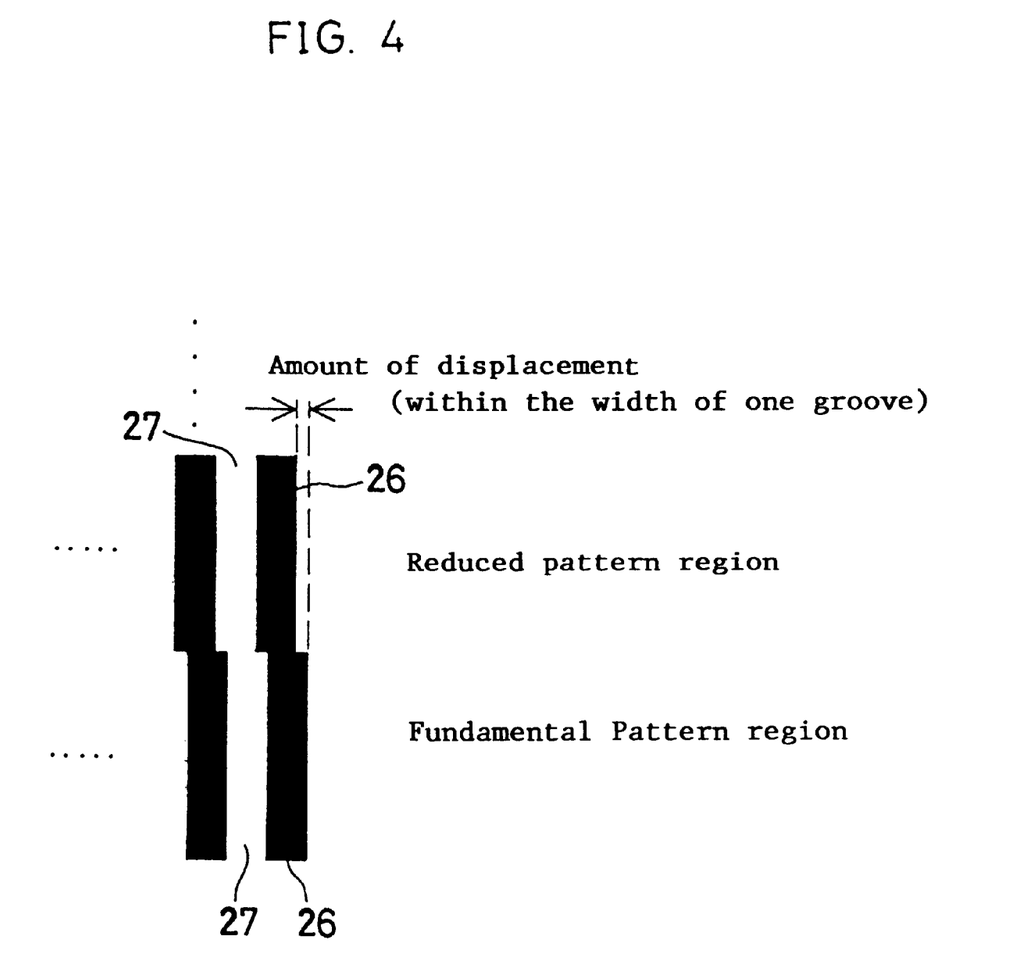
FIG. 4 is a schematic of an amount of displacement between grooves in adjacent regions in the second writing process.

In the writing process shown in FIG. 3, the above reduced scale variation function should be set such that the amount of displacement between groove 26 on one region $B_n$ and groove 26 on the next region $B_{n+1}$ in the direction perpendicular to groove 26 is within the width of one groove 26 even at the horizontal outermost ends, as shown in FIG. 4. Although it is acceptable that writing is carried out while one region $B_n$ is in contact with the adjacent region $B_{n+1}$, it is preferable that both the regions overlap to some extent because the grooves 26 or strips 27 are smoothly joined to each other.

Figure 5A:
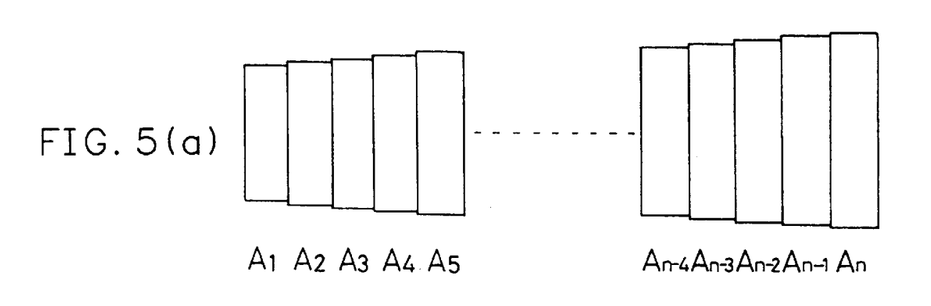
FIGS. 5(a) and 5(b) are schematics for illustrating the writing process according to the invention as compared with a prior art writing process.
Figure 5B:
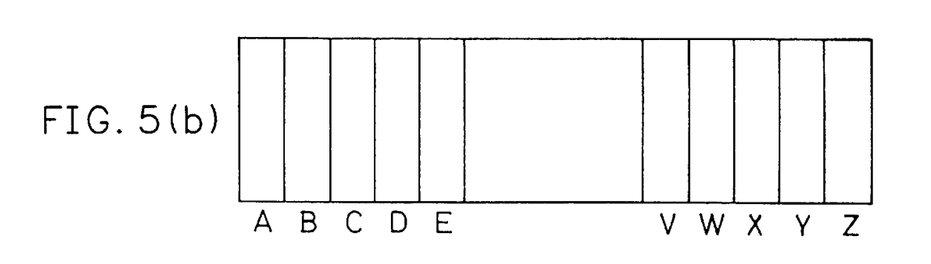

FIG. 5 is a schematic illustrating the writing process of the invention as compared with a prior art writing process. FIG. 5 corresponds to the writing process in FIG. 1, and corresponds nearly to the writing process in FIG. 3 as well. When the pitch of grooves 26 or strips 27 on the phase mask 21 are linearly or nonlinearly increased or decreased in a position-dependent manner, the prior art writing process requires an enormous amount of writing data, and so a number of writing pattern data A, B, C, D, E, . . . , V, W, X, Y and Z, as shown in FIG. 5(b), must be kept on hand. This is in contrast to the writing process of the invention, for which only fundamental pattern data A is needed together with a reduced scale variation function β(x) corresponding to a position x (the position of groove 26 in the direction perpendicular to groove 26 in FIG. 1, and the position of groove 26 in the direction of groove 26 in FIG. 3). For writing, only the use of A×β(x)=$A_n$ and the fundamental pattern data A scaled down depending on the position is needed, as shown in FIG. 5(a). Thus, the amount of writing data can be reduced so that writing can be facilitated. In FIG. 1 and FIG. 5(a), the writing range in the vertical direction varies with position because the reduced scale is varied not only in the horizontal direction but in the vertical direction as well. When the reduced scale is varied in the horizontal direction alone depending on the position (as required in FIG. 3 in particular), the writing range in the vertical direction can be kept constant at every position.

For instance, when one-pitch writing data comprising a 0.125-μm address unit and 10 scanning lines are provided as the fundamental pattern data, the reduced scale is given by (desired grating pitch)/(0.125×10). Using this reduced scale and the fundamental pattern data with an electron beam writing system, grooves are written on an electron beam resist coated on the transparent substrate. One specific embodiment of the phase mask fabrication method of the invention using such a writing process will now be explained.

FIGS. 6(a) to 6(h) are sectional views of steps of fabricating a phase mask according to the invention. Here, reference numeral 10 stand for a phase mask blank, 11 a quartz substrate, 12 a chromium thin film, 12A a chromium thin film pattern, 12B a chromium thin film opening, 13 an electron beam resist, 13A a resist pattern, 13B a resist opening, 14 an electron beam, 21 a phase mask, 26 a groove, and 27 a strip.

Figure 6A:
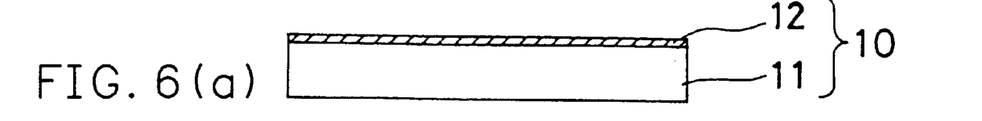
FIGS. 6(a) to 6(h) are process schematics for one embodiment of the phase mask fabrication method according to the invention.

As shown in FIG. 6(a), the chromium thin film 12 of 150 Å in thickness was first formed on quartz substrate 11 to prepare the blank 10. The chromium thin film 12 is useful to prevent charging-up during irradiation of electron beam resist 13 with electron beams 14 at the later step, and acts as a mask in making grooves 26 in the quartz substrate. The thickness of chromium thin film 12 is also important in view of resolution upon chromium thin film etching, and so is preferably in the range of 100 to 200 Å.

Figure 6B:
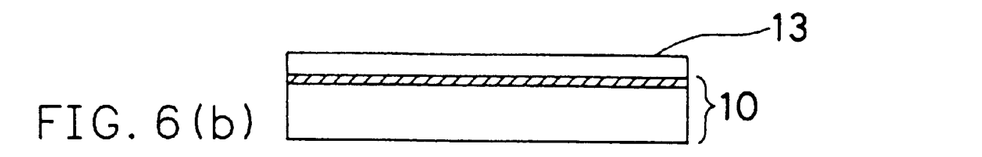

Then, the electron resist 13, e.g., an electron resist RE5100P (made by Hitachi Kasei K.K.) was coated on chromium thin film 12 to a thickness of 400 nm and dried, as shown in FIG. 6(b).

Figure 6C:
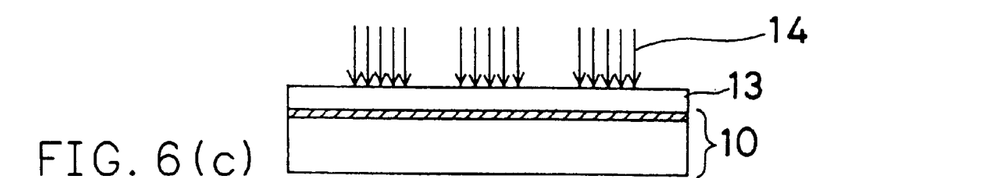

Following this, an electron beam writing system MEBE-SIII (made by ETEC) was used to expose electron beam resist 13 to electron beams 14 at an exposure of 1.2 μC/cm², as shown in FIG. 6(c), while, as explained with reference to FIGS. 1 and 3, the pitch of grooves 26 was linearly increased, from left to right or in a direction perpendicular to the drawing sheet, depending on their position in the direction perpendicular to grooves 26 or their position in the direction of grooves 26, and the widths of grooves 26 and strips 27 were increased with such a change. In this step, the width between the electron beams 14 was sequentially controlled in such a way that one groove was always written with five scanning lines at every position in the raster scan mode.

Figure 6D:
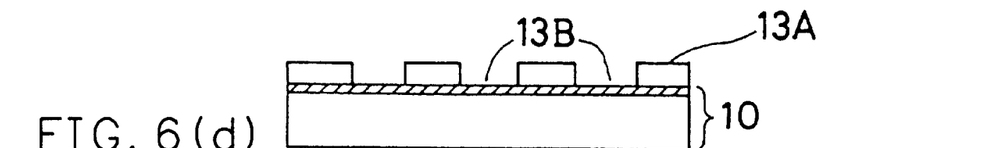

After exposure to the electron beams, baking (post exposure baking or PEB) was carried out at 90° C. for 5 minutes. Thereafter, the electron beam resist 13 was developed with TMAH (tetramethylammonium hydroxide) at a concentration of 2.38% to form such a desired resist pattern 13A as shown in FIG. 6(d). It is here to be noted that the post exposure baking (PEB) was performed to selectively enhance the sensitivity of the portions irradiated with electron beams 14.

Figure 6E:
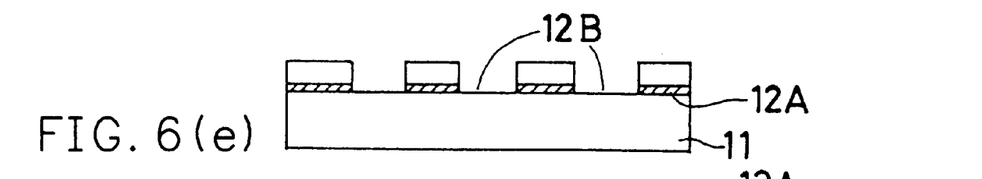

Subsequently, dry etching was carried out using a $CH_2Cl_2$ gas while the resist pattern 13A was used as a mask to form such a chromium thin film pattern 12A as shown in FIG. 6(e).

Figure 6F:
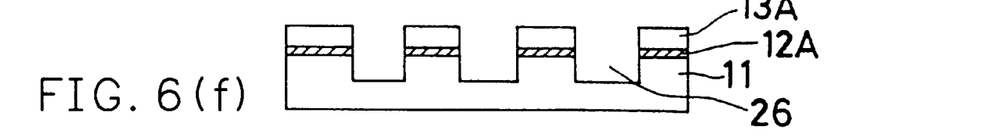

As shown in FIG. 6(f), the quartz substrate 11 was then etched to a depth of exactly 240 nm using a $CF_4$ gas while the chromium thin film pattern 12A was used as a mask. Depth control was carried out by control of etching time, and etching could be performed while the thickness was controlled to the range of 200 to 400 nm.

Figure 6G:
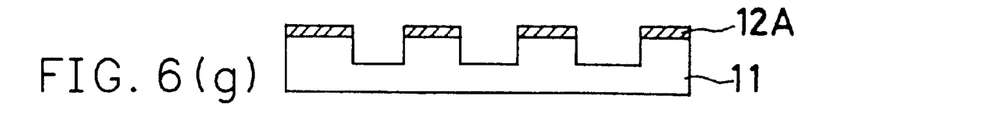
Figure 6H:
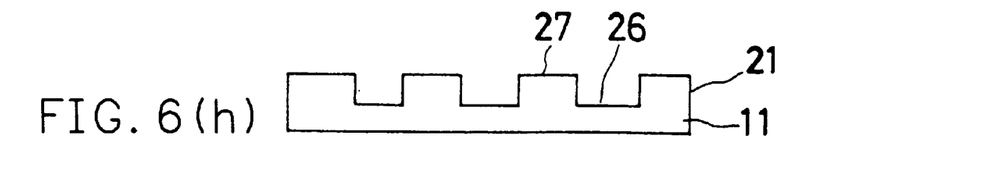

After this, the resist pattern 13A was stripped out with sulfuric acid of 70° C., as shown in FIG. 6(g). Then, the chromium thin film pattern 12A was etched out with an ammonium solution of cerium (IV) nitrate, as shown in FIG. 6(h). Finally, the product was washed to obtain a finished line-and-space (or strip 27-and-groove 26) phase mask 21 having a depth of 240 nm and a pitch changing linearly from 0.85 μm to 1.25 μm in the direction perpendicular to grooves 26 or in the direction of grooves 26.

While the optical fiber-processing phase mask and its fabrication method have been explained with reference to some preferred embodiments, it is to be understood that the invention is in no sense limited thereto and so many modification may be made thereto. While the invention has been explained with reference to the raster scan type electron beam writing system, it is also to be understood that the invention may be carried out using a vector scan or other type electron beam writing system.

POSSIBILITY OF UTILIZATION IN INDUSTRY

As can be obvious from the foregoing explanation, the optical fiber-processing phase mask of the invention and its fabrication method enable a diffraction grating with a varying pitch to be made in an optical fiber. This is because the phase mask of the invention comprises a plurality of juxtaposed patterns, each having a linearly or nonlinearly increasing or decreasing pitch, with a constant width ratio of grooves and strips. If writing data concerning a fundamental pattern comprising one groove and one strip are multiplied by a reduced scale ratio, it is then possible to obtain writing data concerning the entire repetitive pattern of grooves and strips located in a grating from with a pitch varying depending on their position in the direction perpendicular to grooves or in the direction of grooves. Thus, some considerable reductions in the amount of writing data are achieved to make pattern formation easy. This process also enables a phase mask to be fabricated at any desired pitch.

What is claimed is:

1. An optical fiber-processing phase mask comprising on one surface of a transparent substrate a repetitive pattern of grooves and strips located in a grating form, so that an optical fiber is irradiated with diffracted light according to said repetitive pattern to make a diffraction grating in said optical fiber by an interference fringe of diffracted light of different orders, characterized by juxtaposition of a plurality of patterns having a linearly or nonlinearly increasing or decreasing pitch, with a constant width ratio between said grooves and said strips.

2. The optical fiber-processing phase mask according to claim 1, characterized in that said plurality of patterns are juxtaposed in a direction perpendicular to said grooves.

3. The optical fiber-processing phase mask according to claim 1, characterized in that said plurality of patterns are juxtaposed in a direction of said grooves.

4. The optical fiber-processing phase mask according to claim 3, characterized in that an amount of displacement between a groove in one pattern and a groove in another pattern adjacent thereto in a direction perpendicular to said grooves is within a width of one groove even at horizontal outermost ends.

5. The optical fiber-processing phase mask according to any one of claims 1 to 4, characterized in that said patterns have a pitch varying between 0.85 $\mu$m and 1.25 $\mu$m.

6. The optical fiber-processing phase mask according to claim 5, characterized in that a height difference between the grooves and the strips on said patterns is of such a magnitude that a phase shift of approximately $\pi$ occurs upon transmission of optical fiber processing ultraviolet radiation.

7. The optical fiber-processing phase mask according to any one of claims 1 to 4, characterized in that a height difference between the grooves and the strips on said patterns is of such a magnitude that a phase shift of approximately $\pi$ occurs upon transmission of optical fiber processing ultraviolet radiation.

8. A method of fabricating an optical fiber-processing phase mask comprising on one surface of a transparent substrate a repetitive pattern of grooves and strips located in a grating form, so that an optical fiber is irradiated with diffracted light according to said repetitive pattern to make a diffraction grating in said optical fiber by an interference fringe of diffracted light of different orders, characterized in that a plurality of patterns comprising grooves and strips at a varying pitch are written in a juxtaposed relation, thereby fabricating said repetitive pattern of grooves and strips located in a grating form.

9. The phase mask fabrication method according to claim 8, characterized in that said plurality of patterns are juxtaposed in a direction perpendicular to said grooves.

10. The phase mask fabrication method according to claim 9, characterized in that an amount of displacement between a groove in one pattern and a groove in another pattern adjacent thereto in a direction perpendicular to said grooves is within a width of one groove even at horizontal outermost ends.

11. The phase mask fabrication method according to any one of claims 9 to 10, characterized in that said repetitive pattern of grooves and strips located in a grating form is fabricated by continuously writing groove-and-strip patterns having a varying pitch on the basis of writing data concerning a fundamental pattern comprising one groove and one strip while a reduced scale for said writing data concerning a fundamental pattern is varied.

12. The phase mask fabrication method according to claim 11, characterized in that a position-dependent pitch change of the repetitive pattern of grooves and strips located in a grating form is determined depending on a pitch change of the diffraction grating being made in the optical fiber, and is caused by a position-dependent change of said reduced scale for said writing data concerning a fundamental pattern.

13. The phase mask fabrication method according to claim 12, characterized in that said repetitive pattern of grooves and strips located in a grating form is formed by electron beam writing.

14. The phase mask fabrication method according to claim 12, characterized in that said repetitive pattern of grooves and strips located in a grating form has a pitch varying between 0.85 $\mu$m and 1.25 $\mu$m.

15. The phase mask fabrication method according to claim 12, characterized in that a height difference between the grooves and the strips on said patterns is of such a magnitude that a phase shift of approximately $\pi$ occurs upon transmission of optical fiber-processing ultraviolet radiation.

16. The phase mask fabrication method according to claim 11, characterized in that said repetitive pattern of grooves and strips located in a grating form is formed by electron beam writing.

17. The phase mask fabrication method according to claim 11, characterized in that said repetitive pattern of grooves and strips located in a grating form has a pitch varying between 0.85 $\mu$m and 1.25 $\mu$m.

18. The phase mask fabrication method according to claim 11, characterized in that a height difference between the grooves and the strips on said patterns is of such a magnitude that a phase shift of approximately $\pi$ occurs upon transmission of optical fiber-processing ultraviolet radiation.

19. The phase mask fabrication method according to any one of claims 8 to 10, characterized in that said repetitive pattern of grooves and strips located in a grating form is formed by electron beam writing.

20. The phase mask fabrication method according to claim 19, characterized in that said repetitive pattern of grooves and strips located in a grating form has a pitch varying between 0.85 $\mu$m and 1.25 $\mu$m.

21. The phase mask fabrication method according to claim 19, characterized in that a height difference between the grooves and the strips on said patterns is of such a magnitude that a phase shift of approximately $\pi$ occurs upon transmission of optical fiber-processing ultraviolet radiation.

22. The phase mask fabrication method according to any one of claims 8 to 10, characterized in that said repetitive pattern of grooves and strips located in a grating form has a pitch varying between 0.85 $\mu$m and 1.25 $\mu$m.

23. The phase mask fabrication method according to claim 22, characterized in that a height difference between the grooves and the strips on said patterns is of such a magnitude that a phase shift of approximately $\pi$ occurs upon transmission of optical fiber-processing ultraviolet radiation.

24. The phase mask fabrication method according to any one of claims 8 to 10, characterized in that a height difference between the grooves and the strips on said patterns is of such a magnitude that a phase shift of approximately $\pi$ occurs upon transmission of optical fiber-processing ultraviolet radiation.

25. The phase mask fabrication method according to claim 8, characterized in that said plurality of patterns are juxtaposed in a direction of said grooves.

* * * * *